(12) United States Patent
Park

(10) Patent No.: US 11,240,414 B2
(45) Date of Patent: Feb. 1, 2022

(54) CAMERA MODULE HAVING A SLIM OVERALL STRUCTURE AND PORTABLE DEVICE COMPRISING SAME

(71) Applicant: LG INNOTEK CO., LTD., Seoul (KR)

(72) Inventor: Jae Keun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/081,424

(22) Filed: Oct. 27, 2020

(65) Prior Publication Data

US 2021/0067669 A1 Mar. 4, 2021

Related U.S. Application Data

(63) Continuation of application No. 16/097,184, filed as application No. PCT/KR2017/004573 on Apr. 28, 2017, now Pat. No. 10,848,657.

(30) Foreign Application Priority Data

Apr. 29, 2016 (KR) .......................... 10-2016-0052784
May 17, 2016 (KR) .......................... 10-2016-0060304
Jan. 19, 2017 (KR) .......................... 10-2017-0009288

(51) Int. Cl.
*H04N 5/225* (2006.01)
*G02B 7/00* (2021.01)
(Continued)

(52) U.S. Cl.
CPC ........... *H04N 5/2257* (2013.01); *G02B 7/004* (2013.01); *G02B 7/08* (2013.01); *G02B 7/09* (2013.01);
(Continued)

(58) Field of Classification Search
CPC .. H04N 5/2257; H04N 5/2253; H04N 5/2254; H05K 1/144; G02B 7/004;
(Continued)

(56) References Cited

U.S. PATENT DOCUMENTS

2003/0223008 A1* 12/2003 Kim .................... H01L 31/0203
  348/340
2009/0135247 A1 5/2009 Busse
(Continued)

FOREIGN PATENT DOCUMENTS

KR 10-2008-0093679 A 10/2008
KR 10-2009-0102557 A 9/2009
(Continued)

*Primary Examiner* — Usman A Khan
(74) *Attorney, Agent, or Firm* — Birch, Stewart, Kolasch & Birch, LLP

(57) ABSTRACT

A camera module includes a lens driving device having a housing, a first circuit board disposed below the housing, a filter disposed on an upper surface of the first circuit board, a second circuit board disposed below the first circuit board, an image sensor disposed on the second circuit board and coupled to a lower surface of the first circuit board, and a first adhesive member disposed between the lower surface of the first circuit board and an upper surface of the second circuit board, and electrically connecting the first circuit board and the second circuit board. A lower surface of the image sensor is higher than the upper surface of the second circuit board.

20 Claims, 12 Drawing Sheets

(51) Int. Cl.
*H01L 27/146* (2006.01)
*G02B 13/00* (2006.01)
*G02B 7/08* (2021.01)
*G02B 7/09* (2021.01)
*G02B 27/64* (2006.01)
*G03B 5/00* (2021.01)
*G03B 11/00* (2021.01)
*G03B 13/36* (2021.01)
*H01L 23/498* (2006.01)
*H05K 1/14* (2006.01)
*G02B 7/02* (2021.01)
*G02B 5/20* (2006.01)

(52) U.S. Cl.
CPC ......... *G02B 13/001* (2013.01); *G02B 27/646* (2013.01); *G03B 5/00* (2013.01); *G03B 11/00* (2013.01); *G03B 13/36* (2013.01); *H01L 23/498* (2013.01); *H01L 27/14618* (2013.01); *H01L 27/14625* (2013.01); *H01L 27/14636* (2013.01); *H04N 5/2253* (2013.01); *H04N 5/2254* (2013.01); *H05K 1/144* (2013.01); *H05K 1/147* (2013.01); *G02B 5/208* (2013.01); *G02B 7/021* (2013.01)

(58) Field of Classification Search
CPC .... G02B 7/08; G02B 7/09; G03B 5/00; H01L 23/498; H01L 27/14618
USPC .......................................................... 348/342
See application file for complete search history.

(56) References Cited

U.S. PATENT DOCUMENTS

| | | |
|---|---|---|
| 2009/0147381 A1 | 6/2009 | Chen |
| 2010/0086294 A1* | 4/2010 | Lim ........................ G02B 7/023 396/144 |
| 2010/0246035 A1* | 9/2010 | Yamashita ............. G02B 7/023 359/824 |
| 2010/0328525 A1* | 12/2010 | Lee .................... H01L 27/14618 348/374 |
| 2011/0076003 A1* | 3/2011 | Cho .................. H04N 5/232935 396/297 |
| 2011/0205383 A1 | 8/2011 | Shah |
| 2012/0229690 A1* | 9/2012 | Wang ................... H04N 5/2254 348/340 |
| 2013/0119785 A1 | 5/2013 | Han |
| 2013/0313707 A1* | 11/2013 | Choi ....................... H01L 24/16 257/738 |
| 2015/0253583 A1 | 9/2015 | Cho et al. |

FOREIGN PATENT DOCUMENTS

| | | |
|---|---|---|
| KR | 10-2010-0129533 A | 12/2010 |
| KR | 10-2011-0001659 A | 1/2011 |
| KR | 10-1012700 B1 | 2/2011 |
| KR | 10-2012-0029875 A | 3/2012 |
| KR | 10-2015-0104388 A | 9/2015 |

* cited by examiner

CAMERA MODULE HAVING A SLIM OVERALL STRUCTURE AND PORTABLE DEVICE COMPRISING SAME

CROSS REFERENCE TO RELATED APPLICATIONS

This application is a continuation of U.S. application Ser. No. 16/097,184, filed Oct. 26, 2018, which is the National Phase of PCT International Application No. PCT/KR2017/004573, filed on Apr. 28, 2017, which claims priority under 35 U.S.C. 119(a) to Patent Application No. 10-2016-0052784, filed in the Republic of Korea on Apr. 29, 2016, Patent Application No. 10-2016-0060304, filed in the Republic of Korea on May 17, 2016 and Patent Application No. 10-2017-0009288, filed in the Republic of Korea on Jan. 19, 2017, all of which are hereby expressly incorporated by reference into the present application.

TECHNICAL FIELD

Embodiments relate to a camera module and a portable device including the same.

This disclosure relates to an image sensor package and a camera device including the same. More particularly, this disclosure relates to an image sensor package capable of simplifying a process and minimizing a thickness thereof, and a camera device including the same.

BACKGROUND ART

The content described in this part merely provides background information related to embodiments and does not constitute the related art.

A mobile phone or a smart phone, equipped with a camera module which functions to photograph a subject and to store a still image or a moving image of the subject, has been developed. Generally, the camera module may include a lens, an image sensor module, and a lens moving device, which adjusts the distance between the lens and the image sensor module.

The lens moving device may perform auto-focusing to adjust the focal length of the lens by adjusting the distance between an image sensor and the lens.

In addition, the camera module may shake minutely due to, for example, shaking of the user's hand while photographing a subject. In order to correct distortion of a still image or a moving image due to the shaking of the user's hand, a lens moving device, to which an optical image stabilizer (OIS) function is added, has been developed.

Meanwhile, with the miniaturization of the camera module, it has become possible to install the camera module in various electronic devices as well as mobile devices. Recently, as a mobile device capable of improving a communication environment thereof and performing video communication becomes popular, the development of a front camera module having a high-resolution image sensor capable of supporting high-definition video communication has been demanded.

Typically, the front camera module is located in the bezel portion of a mobile device. However, the front camera module having a high-resolution image sensor is larger than a conventional front camera module having a low-resolution image sensor. Thus, when the front camera module having a high-resolution image sensor is installed in order to realize high-definition video communication, the size of a bezel in the mobile device increases and it is difficult to miniaturize the device and to reduce the size of the bezel.

Technical Object

Embodiments relate to a camera module having a slim overall structure and a portable device including the same.

The technical objects acquired by the embodiments are not limited to the technical objects mentioned above, and other unmentioned technical objects will be clearly understood by those skilled in the art, to which the embodiments belong, from the following description.

Embodiments provide a camera module capable of reducing the size thereof and preventing optical tilt.

This disclosure provides an image sensor package capable of simplifying a manufacturing process and reducing the overall thickness thereof and a camera device including the same.

The technical objects acquired by this disclosure are not limited to the technical objects mentioned above, and other unmentioned technical objects will be clearly understood by those skilled in the art, to which this disclosure belongs, from the following description.

Technical Solution

According to one embodiment, a camera module includes: a lens moving device including a base provided at an underside thereof; a first holder coupled to the base and provided with a filter; an image sensor coupled to an underside of the first holder; and a second holder coupled to the first holder and configured to surround the image sensor, wherein the first holder and the second holder are coupled and electrically connected to each other by a conductive adhesive.

The lens moving device may include a bobbin provided so as to move in a first direction; a first coil provided on an outer circumferential surface of the bobbin; a housing inside which the bobbin is provided; a first magnet coupled to the housing; an upper elastic member provided at an upper side of the bobbin to support the bobbin; a lower elastic member provided at a lower side of the bobbin to support the bobbin; the base disposed below the bobbin; and a printed circuit board seated on the base.

The conductive adhesive may be provided as an anisotropic conductive film (ACF).

The first holder and the image sensor may be coupled and electrically connected to each other through a flip chip process.

The first holder and the image sensor may be coupled and electrically connected to each other by a conductive adhesive.

According to the embodiment, the camera module may further include a reinforcement member coupled to a lower surface of the second holder.

The image sensor may be formed with a printed terminal unit, which is adhered to the conductive adhesive and is coupled and electrically connected to the first holder.

The second holder may include a connection board for electrical connection with an external device.

The filter may be an infrared-blocking filter or a blue filter.

The second holder may be formed with a hollow region and the image sensor may be accommodated in the hollow region.

According to the embodiment, the camera module may further include a reinforcement member disposed below the second holder.

The lens moving device may further include: a support member disposed on a side surface of the housing to support movement of the housing in a second direction and/or a third direction; and a second coil disposed so as to be opposite the first magnet.

According to another embodiment, a camera module includes: a lens barrel provided with at least one lens; a bobbin configured to accommodate the lens barrel therein; a cover member configured to accommodate the bobbin therein; a first holder disposed below the bobbin and provided with a filter; an image sensor coupled to an underside of the first holder and provided with a sensing unit, which is disposed so as to be opposite the filter in a first direction; and a second holder coupled to the first h older and configured to surround the image sensor, wherein the first holder and the second holder are coupled and electrically connected to each other by a conductive adhesive, and wherein the image sensor is accommodated in a hollow region formed in the second holder, and a reinforcement member is provided on a lower surface of the second holder so as to close the hollow region.

According to still another embodiment, a camera module includes: a lens moving device including a base at an underside thereof; a first holder coupled to the base and provided with a filter; an image sensor coupled to an underside of the first holder and provided with a sensing unit, which is disposed so as to be opposite the filter in a first direction; and a second holder coupled to the first holder and configured to surround the image sensor, wherein the first holder and the second holder are coupled and electrically connected to each other by a conductive adhesive, and wherein the image sensor is accommodated in a hollow region formed in the second holder, and a reinforcement member is provided on a lower surface of the second holder so as to close the hollow region.

According to an embodiment, a portable device includes a display module including a plurality of pixels, a color of which is varied by an electric signal; the camera module configured to convert an image introduced through a lens into an electric signal; and a controller configured to control an operation of the display module and the camera module.

A camera module according to an embodiment includes: a first printed circuit board; first adhesive members disposed on the first printed circuit board so as to be spaced apart from each other; a second printed circuit board adhered at a lower edge thereof to the first adhesive member; an image sensor coupled to a lower portion of the second printed circuit board and disposed between the first adhesive members; a filter disposed on the second printed circuit board; and a housing disposed on an upper edge of the second printed circuit board.

For example, the centerline of the lower cross section of the housing may be disposed in an area in which it coincides with the centerline of the first adhesive member in a vertical direction.

For example, the first adhesive member may be a solder ball.

For example, a second adhesive member may be disposed between the upper surface of the second printed circuit board and the lower cross section of the housing.

For example, the second adhesive member may include at least one of thermosetting epoxy or UV curing epoxy.

For example, the second printed circuit board may be formed with a groove, into which the lower end of the housing is inserted.

For example, a protrusion may be formed on the upper outer side of the second printed circuit board so as to abut the outer lower end of the housing.

For example, the image sensor may be flip-chip bonded to the second printed circuit board.

For example, an infrared-blocking layer may be disposed on the surface of the filter.

For example, the camera module may further include a lens holder coupled inside the housing and having at least one lens disposed therein.

For example, the camera module may further include a passive element disposed on the edge of the first printed circuit board.

An image sensor package according to an embodiment of the disclosure includes: an image sensor configured to generate image data; a rigid flexible printed circuit board (RFPCB) directly connected to the image sensor and disposed on the image sensor; a filter configured to block a specific wavelength band of light and disposed on the RFPCB; and a reinforcement member disposed between the RFPCB and the filter.

In some embodiments, the RFPCB may further include a connector electrically connected to the RFPCB and serving to transmit the image data to an external host controller, the RFPCB may include an FPCB, which is exposed to the outside between an area connected to the image sensor and an area connected to the connector, and the reinforcement member may be bonded to the RFPCB in the area excluding the FPCB exposed to the outside.

In some embodiments, the reinforcement member may be formed of aluminum.

In some embodiments, the thickness of the RFPCB may range from 0.15 mm to 0.25 mm, and the thickness of the reinforcement member may range from 0.05 mm to 0.15 mm.

In some embodiments, the image sensor and the RFPCB may be electrically connected through a flip chip process.

In some embodiments, an area of the RFPCB, which corresponds to an active area of the image sensor, may be removed.

In some embodiments, the image sensor package may further include a protective cap attached to the RFPCB so as to surround the image sensor.

A camera device according to an embodiment of the disclosure includes: the image sensor package; and a host controller configured to generate a control signal for controlling the image sensor.

The aspects of this disclosure are merely some of exemplary embodiments disclosed here, and various embodiments, in which the technical features of this disclosure are reflected, will be derived and understood based on the detailed description of this disclosure, which will be set forth below, by those skilled in the art.

Advantageous Effects

In the embodiment, unlike an SMT process, when the respective holders are coupled and electrically connected to each other using the ACF, since no separate wire or solder is used, it is possible to reduce the space occupied by wiring and solder, and thus, to reduce the overall length of the camera module in the first direction.

In addition, when using the ACF, since heating only to the melting temperature of an adhesive resin, which is much lower than the melting temperature of a solder, is sufficient, excessive heat is not applied to individual holders, and thus, it is possible to significantly reduce the occurrence of thermal damage to the individual holders.

In addition, due to the structure in which the image sensor is accommodated in the hollow region, a separate space in which the image sensor is disposed is unnecessary in the camera module, and thus, it is possible to reduce the overall length of the camera module. Accordingly, the camera module may have a slim structure as a whole.

The camera module according to the embodiment may be reduced in size and may realize a high-resolution image.

Effects of the device according to the disclosure will be described as follows.

With the image sensor package and the camera device including the same according to the embodiment of the present invention, it is possible to reduce the sum of thicknesses of the image sensor package and the lens assembly, and consequently, to increase the margin of design in the vertical direction of the lens assembly.

In addition, it is possible to increase the margin of design for other modules, which may be disposed under the image sensor, and at the same time, to reduce the overall thickness of the camera device, which may contribute to miniaturization.

In addition, the process required for electrical connection from the image sensor to the PCB substrate requires only one flip chip process, which can simplify the entire process.

The effects acquired by this disclosure are not limited to the effects mentioned above, and other unmentioned effects will be clearly understood by those skilled in the art, to which this disclosure belongs, from the following description.

BEST MODE

Figure 1:
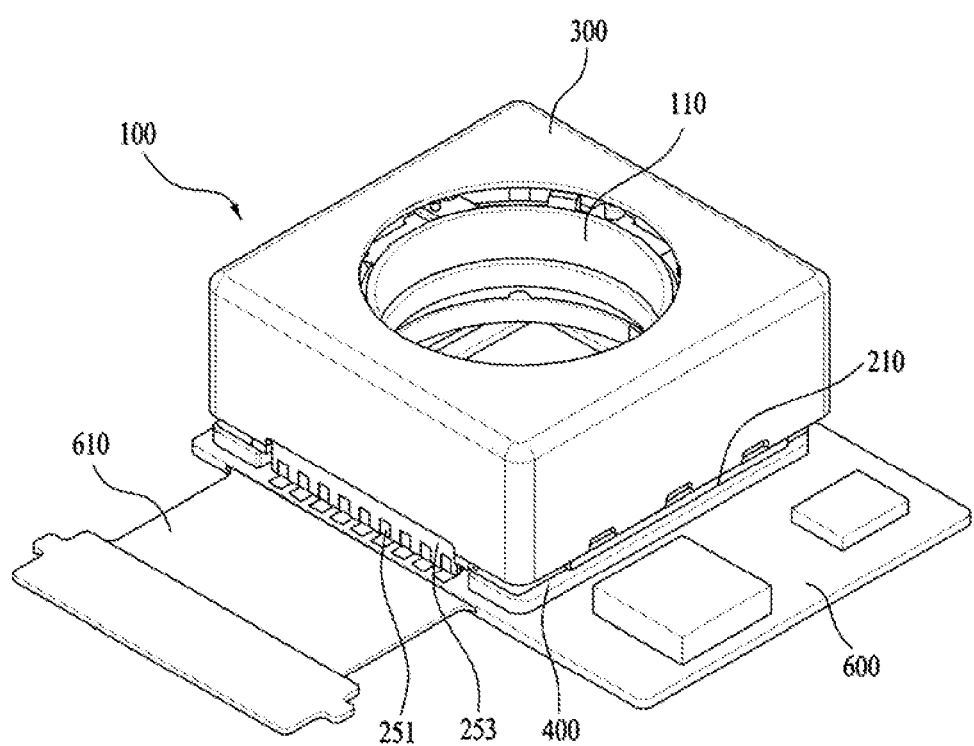
FIG. 1 is a perspective view illustrating a camera module according to an embodiment.

A camera module according to an embodiment of the present invention includes: a lens moving device including a base; a printed circuit board (PCB) including an upper surface, an outer side of which is coupled to the base and an inner side of which is coupled to a filter; an image sensor coupled to an inner side of a lower surface of the PCB; and a flexible printed circuit board (FPCB) coupled to an outer side of the lower surface of the PCB and configured to surround the image sensor, wherein the PCB and FPCB may be coupled and electrically connected to each other by a conductive adhesive.

MODE FOR INVENTION

Hereinafter, the embodiments will be described in detail with reference to the accompanying drawings. The embodiments may be modified in various ways and may take various other forms, and specific embodiments will be illustrated in the drawings and described in detail herein. However, this has no intention to limit the embodiments to the specific forms disclosed herein, and it should be understood that all modifications, equivalents, and substitutions may be devised within the spirit and scope of the embodiments.

Although terms such as, for example, "first" and "second" may be used to describe various elements, the elements should not be limited by the terms. These terms are merely used to distinguish the same or similar elements from each other. In addition, the terms particularly defined taking into consideration the configurations and functions of the embodiments are merely given to describe the embodiments and should not be intended to limit the scope of the embodiments.

In the description of the embodiments, it will be understood that, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "on/upper/above" and "beneath/lower/below", used in the following description may be used to distinguish any one substance or element with another substance or element without requiring or containing any physical or logical relationship or sequence between these substances or elements.

In addition, in the drawings, the orthogonal coordinate system (x, y, z) may be used. In the drawings, the x-axis and the y-axis define a plane orthogonal to the optical axis. For convenience, the optical-axis direction (the z-axis direction) may be referred to as a "first direction", the x-axis direction may be referred to as a "second direction", and the y-axis direction may be referred to as a "third direction".

Figure 2:
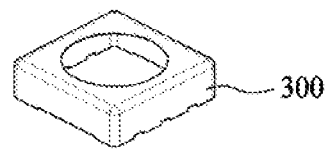
FIG. 2 is an exploded perspective view illustrating a lens moving device according to the embodiment.
Figure 2:
Figure 2:
Figure 2:
Figure 2:
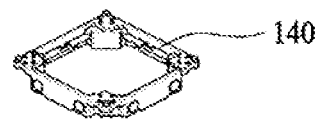
Figure 2:
Figure 2:
Figure 2:
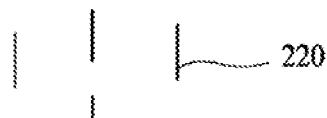
Figure 2:
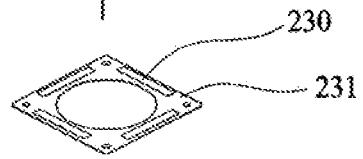
Figure 2:
Figure 2:
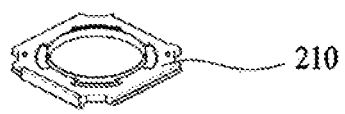

FIG. 1 is a perspective view illustrating a camera module according to an embodiment, and FIG. 2 is an exploded perspective view illustrating a lens moving device 100 according to the embodiment.

An optical image stabilizer, which is applied to a small-sized camera module of a portable device, such as a smart phone or a tablet PC, refers to a device that is configured so as to prevent the outline of a photographed image from being indistinctly formed due to vibrations caused by shaking of the user's hand while photographing a still image.

In addition, an auto-focusing device is a device that automatically focuses the image of a subject on an image sensor 500. The optical image stabilizer and the auto-focusing device may be configured in various ways. In the embodiment, an optical module including a plurality of lenses may be moved in a first direction, or may be moved in a direction perpendicular to the first direction, so as to perform an optical image stabilization operation and/or an auto-focusing operation.

As illustrated in FIG. 1, the camera module according to the embodiment may include the lens moving device 100, a first holder 400, and a second holder 600.

The lens moving device 100 may include a base 210, which is disposed thereunder and is adhered to the first holder 400. As described above, the lens moving device 100 may perform an optical image stabilization operation and/or an auto-focusing operation by moving the optical module composed of the plurality of lenses. The specific structure of the lens moving device 100 will be described below with reference to FIG. 2.

The first holder 400 may be coupled to the base 210, and a filter 410 may be mounted on the first holder. In addition, the image sensor 500 may be coupled to the underside of the first holder 400. The image sensor 500 will be described below in detail with reference to FIG. 4, for example. The second holder 600 may be disposed below the first holder 400. Meanwhile, the first holder, the image sensor, and the second holder may be provided as circuit boards.

The second holder 600 may include various driving drivers for driving the lens moving device 100 and circuits for receiving current, receiving electric signals from external devices, or transmitting electric signals to the external devices. Of course, in the case of a camera module which does not have an auto-focusing function or an optical image stabilization function and does not require a separate lens moving device, the second holder 600 may not include a driver.

In addition, the second holder 600 may be provided with a connection board 610 for electrical connection between the second holder 600 and an external device such as, for example, a power supply, a display device, or a storage device.

The first holder 400 and the second holder 600 will be described below in detail with reference to FIG. 3 and the following drawings.

As illustrated in FIG. 2, the lens moving device 100 according to the embodiment may include a movable unit and a fixed unit. Here, the movable unit may perform the auto focusing function of a lens. The movable unit may include a bobbin 110 and a first coil 120. The fixed unit may include a first magnet 130, a housing 140, an upper elastic member 150, and a lower elastic member 160.

The bobbin 110 may be provided so as to move in the first direction inside the housing 140, may be provided on the outer circumferential surface thereof with the first coil 120, which is disposed inside the first magnet 130, and may be provided in the inner space of the housing 140 so as to be reciprocally movable in the first direction by electromagnetic interaction between the first magnet 130 and the first coil 120. The first coil 120 may be provided on the outer circumferential surface of the bobbin 110 so as to enable electromagnetic interaction with the first magnet 130.

In addition, the bobbin 110 may be elastically supported by the upper and lower elastic members 150 and 160, and may perform an auto-focusing function by moving in the first direction.

The bobbin 110 may include a lens barrel (not illustrated) in which at least one lens is provided. The lens barrel may be coupled inside the bobbin 110 in various ways.

For example, the lens barrel may be coupled to the bobbin 110 using an adhesive or the like. In addition, the lens barrel may be coupled to the bobbin 110 through screwing. Alternatively, one or more lenses may be integrally formed with the bobbin 110 without a lens barrel.

Only one lens may be coupled to the lens barrel, or two or more lenses may be configured so as to form an optical system.

The auto-focusing function may be controlled according to the direction of current, and the auto-focusing function may be realized by moving the bobbin 110 in the first direction. For example, when forward current is applied, the bobbin 110 may move upwards from the initial position thereof, and when reverse current is applied, the bobbin 110 may move downwards from the initial position thereof. Alternatively, the amount of unidirectional current may be adjusted to increase or decrease the distance of movement from the initial position in a given direction.

The upper and lower surfaces of the bobbin 110 may be formed with a plurality of upper support protrusions and lower support protrusions. The upper support protrusions may be provided in a cylindrical shape or in a prismatic shape, and may serve to couple and fix the upper elastic member 150. The lower support protrusions may be provided in a cylindrical shape or in a prismatic shape, and may serve to couple and fix the lower elastic member 160.

Here, the upper elastic member 150 may be formed with through-holes corresponding to the upper support protrusions, and the lower elastic member 160 may be formed with through-holes corresponding to the lower support protrusions. The respective support protrusions and the through-holes may be fixedly coupled to each other using an adhesive member, such as epoxy, or by thermal bonding.

The housing 140 may take the form of a hollow column to support the first magnet 130, and may have a substantially rectangular shape. The first magnet 130 may be coupled to and disposed on the side surface portion of the housing 140. In addition, as described above, the bobbin 110, which is guided by the upper and lower elastic members 150 and 160 so as to move in the first direction, may be disposed inside the housing 140.

The upper elastic member 150 may be provided at the upper side of the bobbin 110 and the lower elastic member 160 may be provided at the lower side of the bobbin 110. The upper elastic member 150 and the lower elastic member 160 may be coupled to the housing 140 and the bobbin 110, and the upper elastic member 150 and the lower elastic member 160 may elastically support the upward movement and/or the downward movement of the bobbin 110 in the first direction. The upper elastic member 150 and the lower elastic member 160 may be provided as leaf springs.

As illustrated in FIG. 2, the upper elastic member 150 may be provided as a plurality of parts separated from each other. Through such a multi-split structure, the respective split parts of the upper elastic member 150 may receive current having different polarities or different voltages. In addition, the lower elastic member 160 may have a multi-split structure and may be electrically connected to the upper elastic member 150.

Meanwhile, the upper elastic member 150, the lower elastic member 160, the bobbin 110, and the housing 140 may be assembled through thermal bonding and/or bonding using an adhesive or the like.

The base 210 may be disposed below the bobbin 110 and may be provided in a substantially rectangular shape, and a printed circuit board 250 may be disposed or seated on the base.

A surface of the base 210, which faces a portion of the printed circuit board 250 in which a terminal surface 253 is formed, may be formed with a support groove having a size corresponding to the terminal surface. The support groove may be recessed inward to a predetermined depth from the outer circumferential surface of the base 210 so as to prevent the portion, on which the terminal surface 253 is formed, from protruding outwards or to adjust the extent to which the portion protrudes.

A support member 220 may be disposed on the side surface of the housing 140 so as to be spaced apart from the housing 140. The support member may be coupled at the upper end thereof to the upper elastic member 150 and at the lower end thereof to the base 210, the printed circuit board 250, or a circuit member 231. The support member may support the bobbin 110 and the housing 140 so as to be movable in the second direction and/or the third direction perpendicular to the first direction, and may also be electrically connected to the first coil 120.

According to the embodiment, a total of four support members 220 may be symmetrically provided since they are respectively disposed on the outer surfaces of the respective corners of the housing 140. In addition, the support member 220 may be electrically connected to the upper elastic member 150. That is, for example, the support member 220 may be electrically connected to a portion of the upper elastic member 150 in which a through-hole is formed.

In addition, since the support member 220 is formed separately from the upper elastic member 150, the support member 220 and the upper elastic member 150 may be electrically connected to each other using a conductive adhesive material, a solder, or the like. Accordingly, the upper elastic member 150 may apply electric current to the first coil 120 through the support member 220, which is electrically connected thereto.

The support member 220 may be connected to the printed circuit board 250 through through-holes formed in the circuit member 231 and the printed circuit board 250. Alternatively, the support member 220 may be electrically soldered to a corresponding portion of the circuit member 231 without forming through-holes in the circuit member 231 and/or the printed circuit board 250.

Meanwhile, in FIG. 2, the linear support member 220 is illustrated as one embodiment, but the disclosure is not limited thereto. That is, the support member 220 may be provided as a plate-shaped member or the like.

A second coil 230 may perform optical image stabilization by moving the housing 140 in the second direction and/or in the third direction through electromagnetic interaction with the first magnet 130.

Here, the second and third directions may include directions substantially close to the x-axis direction (or the first direction) and the y-axis direction (or the second direction) as well as the x-axis and y-axis directions. In other words, the housing 140 may move in directions parallel to the x-axis and the y-axis when viewed in terms of driving in the embodiment, but may also move in directions slightly oblique to the x-axis and the y-axis when moving while being supported by the support member 220.

Therefore, the first magnet 130 may need to be provided at a position corresponding to the second coil 230.

The second coil 230 may be disposed so as to be opposite the first magnet 130 fixed to the housing 140. In an embodiment, the second coil 230 may be disposed outside the first magnet 130. Alternatively, the second coil 230 may be spaced apart downwards from the first magnet 130 by a predetermined distance.

According to the embodiment, a total of four second coils 230 may be provided on four side portions of the circuit member 231, but the disclosure is not limited thereto. Only two second coils including, for example, one second coil on a second side in the second direction and one second coil on a third side in the third direction may be provided, or more than four second coils may be provided.

Alternatively, a total of six second coils may be provided such that one second coil is provided on a first side in the second direction, two second coils are provided on the second side in the second direction, one second coil is provided on the third side in the third direction, and two second coils are provided on a fourth side in the third direction. Alternatively, in this case, the first side and the fourth side may be next to each other, and the second side and the third side may be next to each other.

In the embodiment, a circuit pattern may be formed on the circuit member 231 to have the shape of the second coil 230, or a separate second coil may be disposed on the top of the circuit member 231, but the disclosure is not limited thereto. A circuit pattern may be formed directly on the top of the circuit member 231 to have the shape of the second coil 230.

Alternatively, the second coil 230 may be configured by winding a wire in a doughnut shape, or the second coil 230 may be formed to have an FP coil shape and be electrically connected to the printed circuit board 250.

The circuit member 231 including the second coil 230 may be provided or disposed on the upper surface of the printed circuit board 250, which is disposed at the upper side of the base 210. However, the disclosure is not limited thereto. The second coil 230 may be disposed in close contact with the base 210, may be spaced apart from the base 210 by a predetermined distance, or may be formed on a separate board so that the board is stacked on and connected to the printed circuit board 250.

The printed circuit board 250 may be electrically connected to at least one of the upper elastic member 150 or the lower elastic member 160 and may be coupled to the upper surface of the base 210. As illustrated in FIG. 2, the printed circuit board may be formed with a through-hole, into which the support member 220 is inserted, at a position that corresponds to an end of the support member 220. Alternatively, the printed circuit board may be electrically connected and/or bonded to the support member without forming a through-hole.

A terminal 251 may be disposed or formed on the printed circuit board 250. In addition, the terminal 251 may be disposed on the bent terminal surface 253. A plurality of terminals 251 may be disposed on the terminal surface 253, and may supply current to the first coil 120 and/or the second coil 230 when receiving an external voltage. The number of terminals formed on the terminal surface 253 may be increased or decreased based on the type of constituent elements that need to be controlled. In addition, the printed circuit board 250 may include one terminal surface 253 or two or more terminal surfaces.

A cover member 300 may be provided in a substantially box shape, may accommodate, for example, the movable unit, the second coil 230, and a portion of the printed circuit board 250 therein, and may be coupled to the base 210. The cover member 300 may protect, for example, the movable unit, the second coil 230, and the printed circuit board 250, which are accommodated therein, so as to prevent damage thereto. In addition, the cover member may limit outward leakage of an electromagnetic field, which is created by, for example, the first magnet 130, the first coil 120, and the second coil 230 therein, thereby enabling the electromagnetic field to be focused.

The embodiment of the camera module having the auto-focusing function and the optical image stabilization function has been described above.

On the other hand, according to another embodiment, the camera module may include a lens moving device, which has an auto-focusing function but does not have an optical image stabilization function. In this case, for example, the lens moving device may be obtained by removing the support member 220, the second coil 230, and the circuit member including the second coil 230 from the lens moving device illustrated in FIG. 2.

According to still another embodiment of the present invention, the camera module may be provided in a structure having no auto-focusing and optical image stabilization functions. In this case, for example, the camera module may include the lens barrel, the bobbin 110, which accommodates the lens barrel therein, and the cover member 300, which accommodates the bobbin therein.

Figure 3:
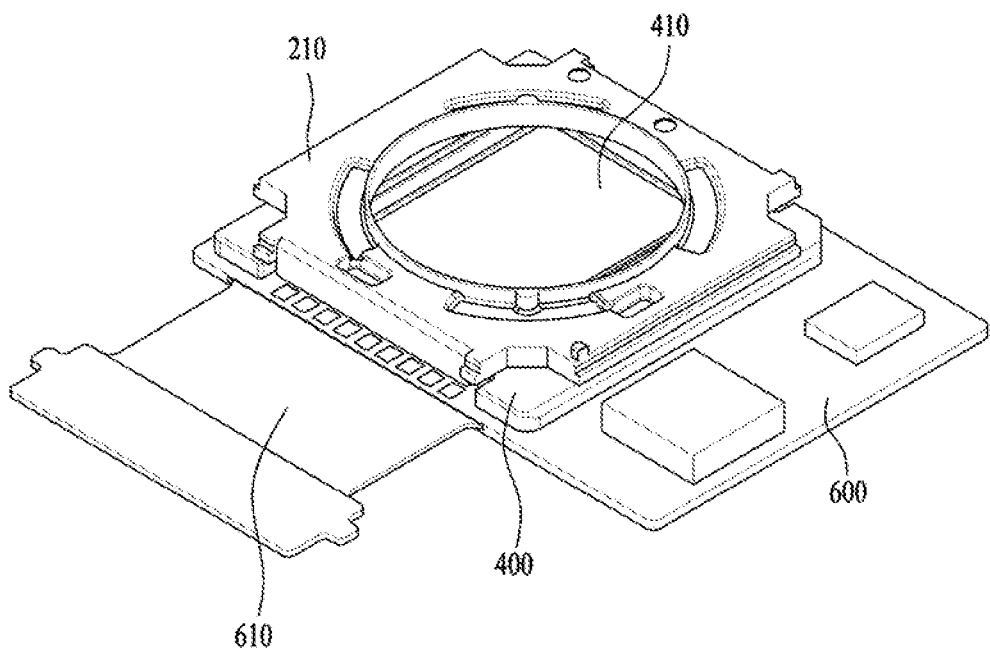
FIG. 3 is a perspective view illustrating a base, a first holder, and a second holder according to the embodiment.

FIG. 3 is a perspective view illustrating the base 210, the first holder 400, and the second holder 600 according to an embodiment.

The filter 410 may be mounted in the first holder 400. The filter 410 may be mounted in the first holder 400 at a position at which it faces the lens barrel and the image sensor 500 in the first direction. The filter 410 may filter light within a specific wavelength range of incident light directed through the lens barrel, and the light, which has passed through the filter 410, may be incident on a sensing unit 510 provided in the image sensor 500.

The first holder 400 may be a printed circuit board (PCB) for transmitting a voltage, a control signal, an image signal, or the like, but the scope of the disclosure is not limited thereto. Here, the filter 410 may be, for example, an infrared filter that prevents infrared light from being incident on the image sensor 500. In another embodiment, the filter 410 may be a blue filter. The blue filter may be formed on the surface thereof with a coating layer for blocking ultraviolet light, and may advantageously effectively prevent ghost and flare phenomena, which occur in an image formed on the sensing unit 510, unlike a general infrared filter.

The second holder 600 may be formed of a flexible material or a hard material. However, in order to allow the connection board 610, which is electrically connected to the second holder 600, to be easily connected to external devices and the camera module, the second holder may be formed of a flexible material that is easily changed in position.

The second holder 600 may be a flexible printed circuit board (FPCB), which transmits a voltage, a control signal, an image signal or the like and is easily deformed according to design specifications, but the scope of the disclosure is not limited thereto.

Figure 4:
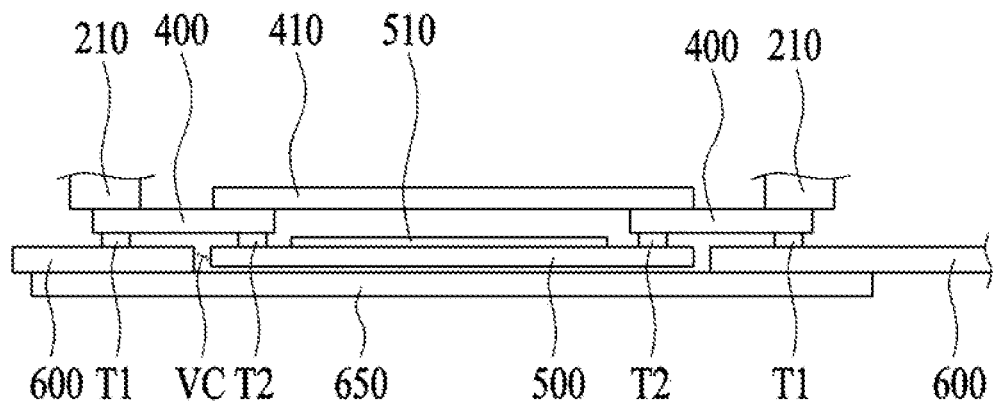
FIG. 4 is a schematic side cross-sectional view of a camera module according to the embodiment.
Figure 5:
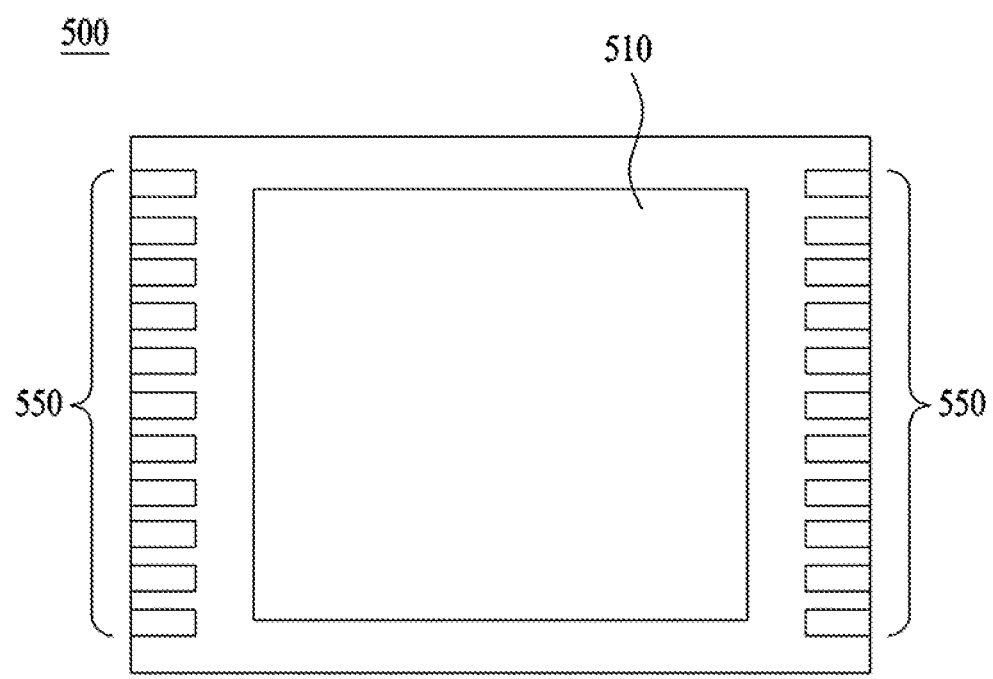
FIG. 5 is a schematic plan view of an image sensor according to the embodiment.
Figure 6:
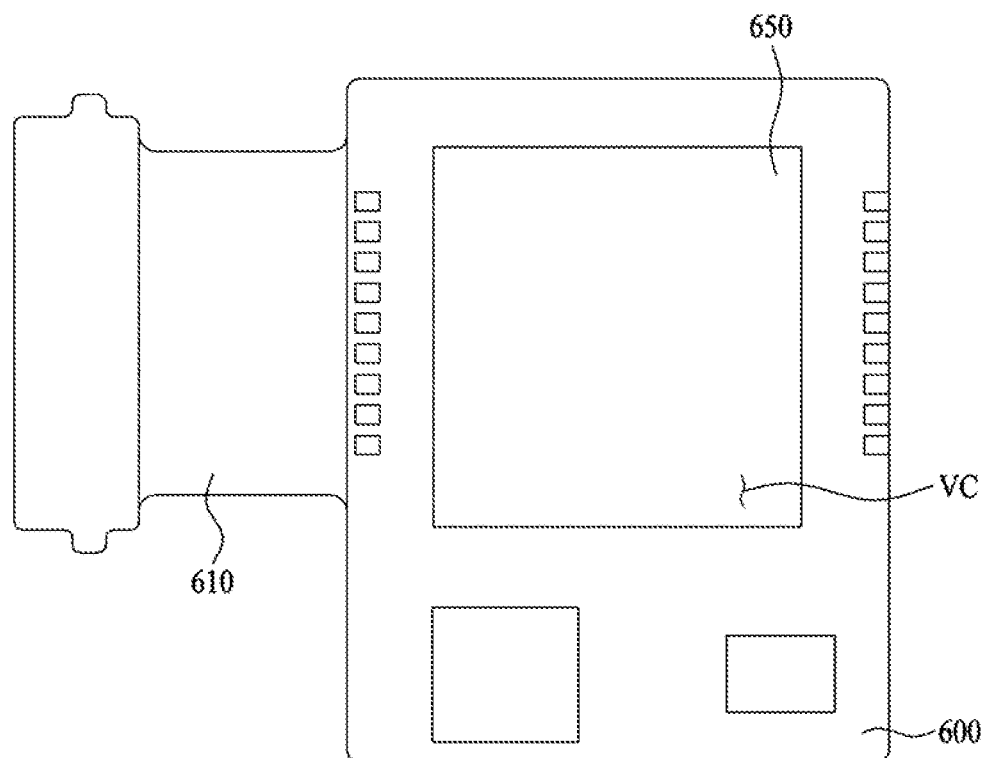
FIG. 6 is a schematic plan view of a second holder, a connection board, and a reinforcement member according to the embodiment.

FIG. 4 is a schematic side cross-sectional view of a camera module according to the embodiment. FIG. 5 is a schematic plan view of the image sensor 500 according to the embodiment. FIG. 6 is a schematic plan view of the second holder 600, the connection board 610, and a reinforcement member 650 according to the embodiment.

As illustrated in FIG. 4, the camera module may further include the image sensor 500. The image sensor 500 may be coupled to the underside of the first holder 400, and the sensing unit 510 may be mounted on the image sensor. Here, the sensing unit 510 of the image sensor 500 may be disposed in the first direction so as to be opposite the filter 410. The sensing unit 510 is a region on which light, which has passed through the filter 410, is incident to form an image.

As illustrated in FIG. 4, the filter 410 may be coupled to the inner side of the upper surface of the first holder 400, and the base 210 may be coupled to the outer side of the upper surface of the first holder. The image sensor 500 may be coupled to the inner side of the lower surface of the first holder 400, and the second holder 600 may be coupled to the outer side of the lower surface of the first holder 400. Here, the inner side and the outer side may be defined on the basis of the center of the incident surface of the light, which has passed through the filter 410. The filter 410 may be attached and coupled to the upper surface of the first holder 400 by an adhesive such as epoxy, for example.

The light, which has passed through the filter 410, may be incident on the sensing unit 510. Thus, as illustrated in FIG. 4, a through-hole may be formed in the first holder 400 so that light may pass therethrough in a region in which the filter 410 and the sensing unit 510 are opposite each other.

Meanwhile, the first holder 400 and the image sensor 500 may be coupled and electrically connected to each other. As illustrated in FIG. 4, the first holder 400 and the image sensor 500 may be coupled and electrically connected to each other by a second coupling portion T2.

The coupling and electrical connection between the first holder 400 and the image sensor 500 may be realized through, for example, a flip chip process. That is, the second coupling portion T2 may be formed through a flip chip process.

The flip chip process may be performed by, for example, spraying a conductive material onto the first holder 400 and/or the image sensor 500 to attach the first holder 400 and the image sensor 500 to each other. The first holder 400 and the image sensor 500 may be coupled and electrically connected to each other via fusion of the conductive material.

The flip chip process has a simpler structure, and more particularly, a thinner coupling region than a surface mount technology (SMT) process, which is commonly used for the coupling and electrical connection of a board. Therefore, the flip chip process may reduce the overall length of the camera module in the first direction.

Meanwhile, in another embodiment, the coupling and electrical connection between the first holder 400 and the image sensor 500 may be realized using a conductive adhesive. That is, in FIG. 4, the second coupling portion T2, which couples and electrically interconnects the first holder 400 and the second holder 600, may be formed of a conductive adhesive.

The conductive adhesive may be, for example, an anisotropic conductive film (ACF). Such a conductive adhesive will be described in detail with relation to the coupling structure of the first holder 400 and the second holder 600.

The first holder 400 and the second holder 600 may be coupled and electrically connected to each other using a conductive adhesive. That is, in FIG. 4, a first coupling portion T1, which couples and electrically interconnects the first holder 400 and the second holder 600, may be formed of a conductive adhesive.

The conductive adhesive may be, for example, an anisotropic conductive film (ACF). The ACF is entirely in the form of a film, and may be made by mixing conductive particles, for example, gold (Au) or nickel (Ni) particles with an adhesive resin.

The first holder 400 and the second holder 600 are coupled to each other by disposing the ACF on a coupling portion of the first holder 400 and the second holder 600 and pressing and heating the ACF, and may be electrically connected to each other by the conductive particles.

When the first holder 400 and the second holder 600 are coupled and electrically connected to each other by the SMT process, a wire and a solder may be used. Therefore, in the case of the SMT process, the space occupied by the wire and the solder is required, so that the overall length of the camera module in the first direction may be increased.

In addition, in the SMT process, the process of melting and curing the solder may be repeated, and to this end, excessive heat may be applied to the respective holders. Therefore, thermal damage to the holders, which are provided in a board shape, may occur.

However, since the ACF does not use separate wire or solder, the space occupied by the wire and the solder may be eliminated, and thus the overall length of the camera module in the first direction may be reduced.

In addition, in the case of using the ACF, since heating only to the melting temperature of the adhesive resin, which is much lower than the melting temperature of the solder, is sufficient, excessive heat is not applied to individual holders, and thus, it is possible to significantly reduce the occurrence of thermal damage to the individual holders.

In an embodiment, the camera module may further include the reinforcement member 650. The reinforcement member 650 may be disposed below the second holder 600 and may be coupled to the lower surface of the second holder 600, for example. As illustrated in FIG. 6, the reinforcement member 650 may be provided in a plate shape, for example, and may be formed of a material including stainless steel, for example.

The second holder 600 may be formed with a hollow region VC for accommodating therein the image sensor 500, and foreign substances may be introduced into the camera module due to the hollow region VC.

Therefore, the reinforcement member 650 may function to close the hollow region VC so as to prevent foreign substances from being introduced into the camera module. The reinforcement member 650 may be adhered to the lower surface of the second holder 600 using an adhesive such as, for example, epoxy in order to effectively seal the hollow region VC.

As illustrated in FIG. 5, the image sensor 500 may include a printed terminal unit 550. The conductive adhesive may be adhered to the printed terminal unit 550 so that the printed terminal unit 550 may be coupled and electrically connected to the first holder 400.

That is, the second coupling portion T2 may be coupled to the printed terminal unit 550. Here, the sensing unit 510 may be electrically connected to the first holder 400 via the printed terminal unit 550.

Meanwhile, the second holder 600 may be coupled to the first holder 400 and may surround the image sensor 500. As illustrated in FIG. 4, the second holder 600 may be formed with the hollow region VC, and the image sensor 500 may be accommodated in the hollow region VC.

Since the image sensor 500 is accommodated in the hollow region VC, the camera module does not require a separate space in which the image sensor 500 is disposed, and thus, the overall length of the camera module in the first direction may be reduced. Accordingly, the camera module may have a slim overall structure.

Figure 7:
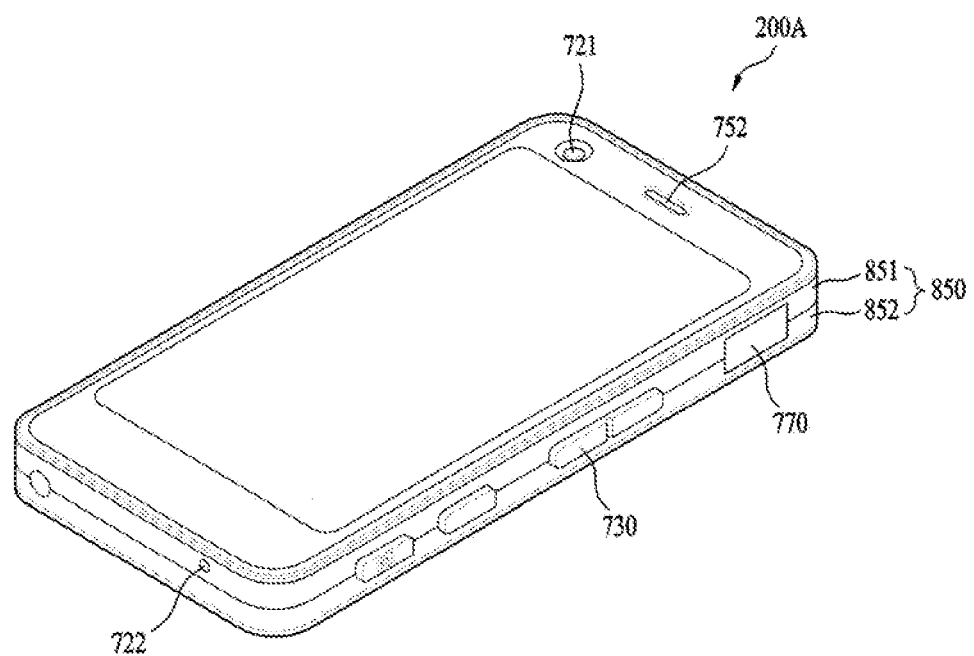
FIG. 7 is a perspective view illustrating a portable device according to an embodiment.
Figure 8:
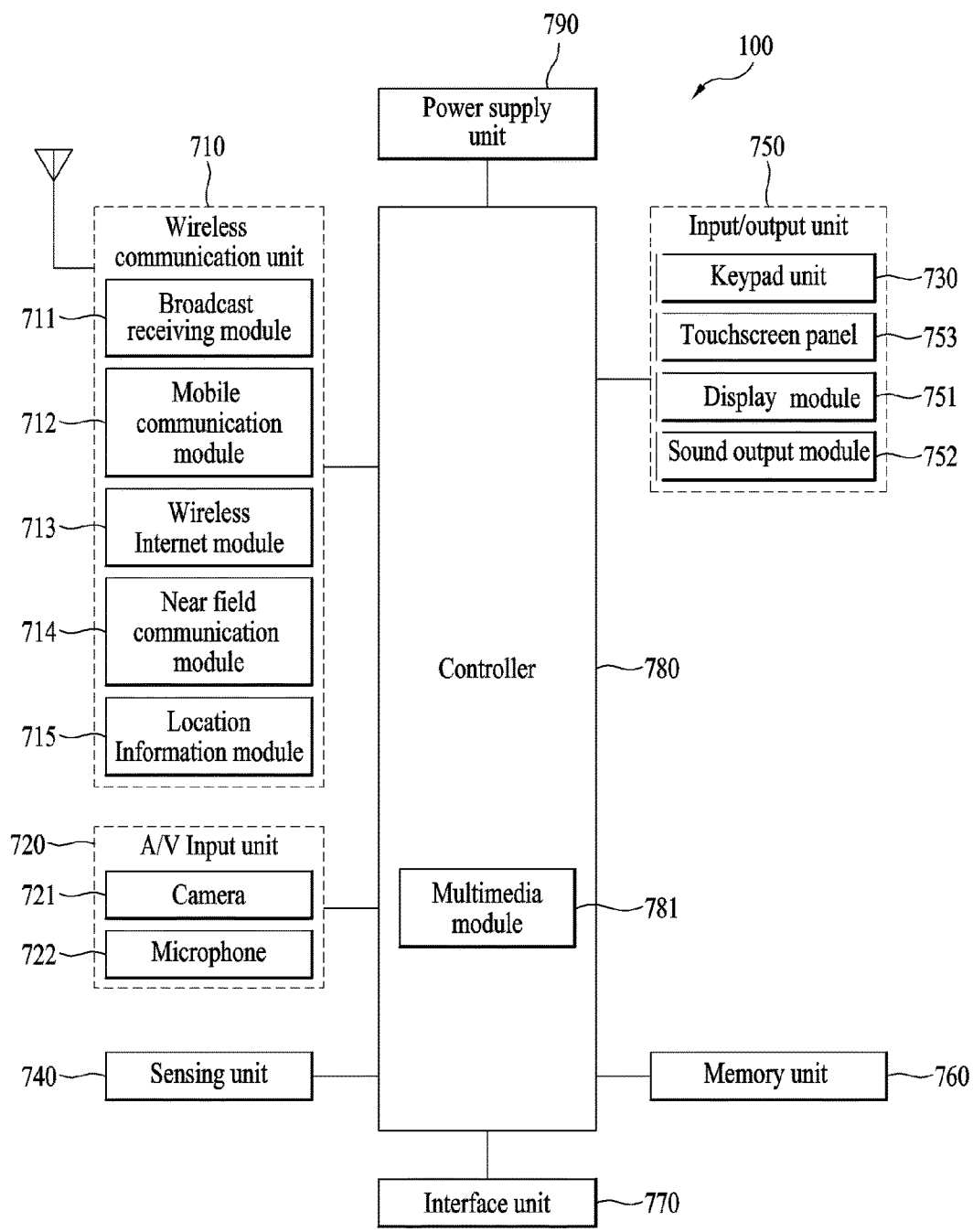
FIG. 8 is a view illustrating the configuration of the portable device illustrated in FIG. 7.

FIG. 7 is a perspective view illustrating a portable device according to an embodiment. FIG. 8 is a view illustrating the configuration of the portable device illustrated in FIG. 7.

Referring to FIGS. 7 and 8, the portable device 200A (hereinafter referred to as a "device") may include a body 850, a wireless communication unit 710, an A/V input unit 720, a sensing unit 740, an input/output unit 750, a memory 760, an interface unit 770, a controller 780, and a power supply unit 790.

The body 850 illustrated in FIG. 7 has a bar shape, but is not limited thereto. The body may have any of various structures such as a slide type, a folder type, a swing type, or a swivel type, in which two or more sub-bodies are coupled so as to be movable relative to each other.

The body 850 may include a case (e.g., a casing, a housing, or a cover) forming the external appearance thereof. For example, the body 850 may be divided into a front case 851 and a rear case 852. Various electronic components of the device may be mounted in the space formed between the front case 851 and the rear case 852.

The wireless communication unit 710 may include one or more modules, which enable wireless communication between the device 200A and a wireless communication system or between the device 200A and the network in which the device 200A is located. For example, the wireless communication unit 710 may include a broadcast receiving module 711, a mobile communication module 712, a wireless Internet module 713, a near field communication module 714, and a location information module 715.

The audio/video (A/V) input unit 720 serves to input an audio signal or a video signal, and may include a camera 721 and a microphone 722.

The camera 721 may be the camera including the lens moving device 100 according to the embodiment illustrated in FIG. 2.

The sensing unit 740 may sense the current state of the device 200A, such as the opening/closing state of the device 200A, the position of the device 200A, the presence or absence of a user touch, the orientation of the device 200A, and the acceleration/deceleration of the device 200A, and may generate a sensing signal for controlling the operation of the device 200A. For example, when the device 200A is in the form of a slide phone, the sensing unit may sense whether the slide phone is opened or closed. In addition, the sensing unit functions to sense whether or not the power supply unit 790 supplies a voltage, or whether or not the interface unit 770 is connected to an external device.

The input/output unit 750 serves to generate input or output related to a visual sense, auditory sense, tactile sense, or the like. The input/output unit 750 may generate input data for controlling the operation of the device 200A, and may also display information processed in the device 200A.

The input/output unit 750 may include a keypad unit 730, a display module 751, a sound output module 752, and a touchscreen panel 753. The keypad unit 730 may generate input data in response to input made on a keypad.

The display module 751 may include a plurality of pixels, the color of which is varied in response to an electric signal. For example, the display module 751 may include at least one selected from among a liquid crystal display, a thin film transistor-liquid crystal display, an organic light-emitting diode, a flexible display, and a three-dimensional display (3D display).

The sound output module 752 may output audio data received from the wireless communication unit 710 in a call signal reception mode, a call mode, a recording mode, a voice recognition mode, a broadcast reception mode, or the like, or may output audio data stored in the memory 760.

The touchscreen panel 753 may convert a change in capacitance caused by a user's touch on a specific area of a touchscreen into an electric input signal.

The memory 760 may store a program for processing and controlling the controller 780, and may temporarily store input/output data (e.g., a telephone directory, messages, audio, still images, photographs, and moving images). For example, the memory 760 may store an image photographed by the camera 721, for example, a photograph or a moving image.

The interface unit 770 serves as a connection path for an external device connected to the device 200A. The interface unit 770 receives data from the external device, or receives a voltage and transmits the voltage to each component in the device 200A, or allows data in the device 200A to be transmitted to the external device. For example, the interface unit 770 may include a wired/wireless headset port, an external charger port, a wired/wireless data port, a memory card port, a port for connecting a device equipped with an identification module, an audio input/output (I/O) port, a video input/output (VP) port, an earphone port, and the like.

The controller 780 may control the overall operation of the device 200A. For example, the controller 780 may perform related control and processing for voice call, data communication, video call, and the like. The controller 780 may include a panel controller 144 of the touchscreen panel drive unit illustrated in FIG. 1 or may perform the function of the panel controller 144.

The controller 780 may include a multimedia module 781 for multimedia playback. The multimedia module 781 may be provided in the controller 180, or may be provided separately from the controller 780.

The controller 780 perform a pattern recognition process for recognizing handwriting input or drawing input performed on the touchscreen as characters and images, respectively.

The power supply unit 790 may supply external power or internal power according to the control of the controller 780, and may supply the voltage required for the operation of the respective components.

Figure 9A:
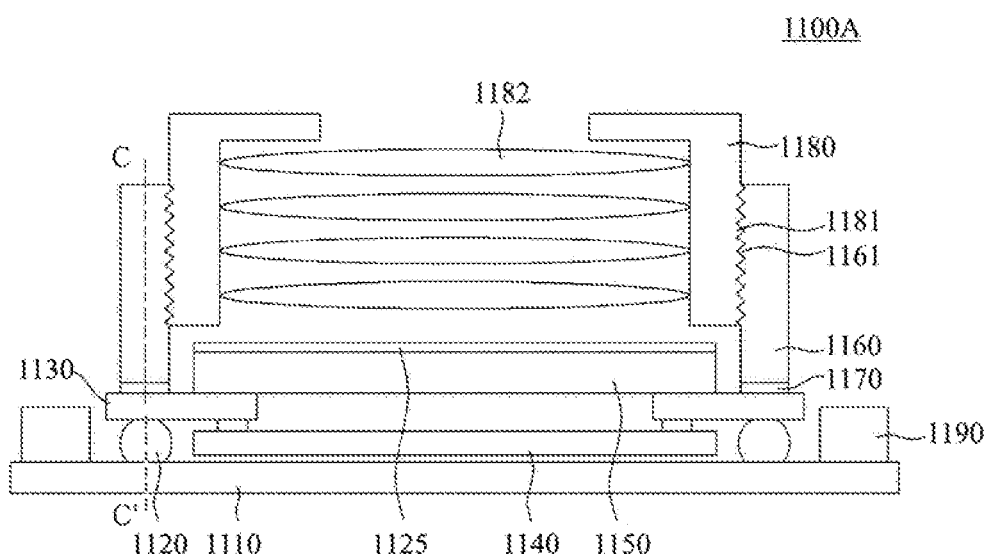
FIGS. 9a and 9b are cross-sectional views illustrating a camera module according to a first embodiment.
Figure 9B:
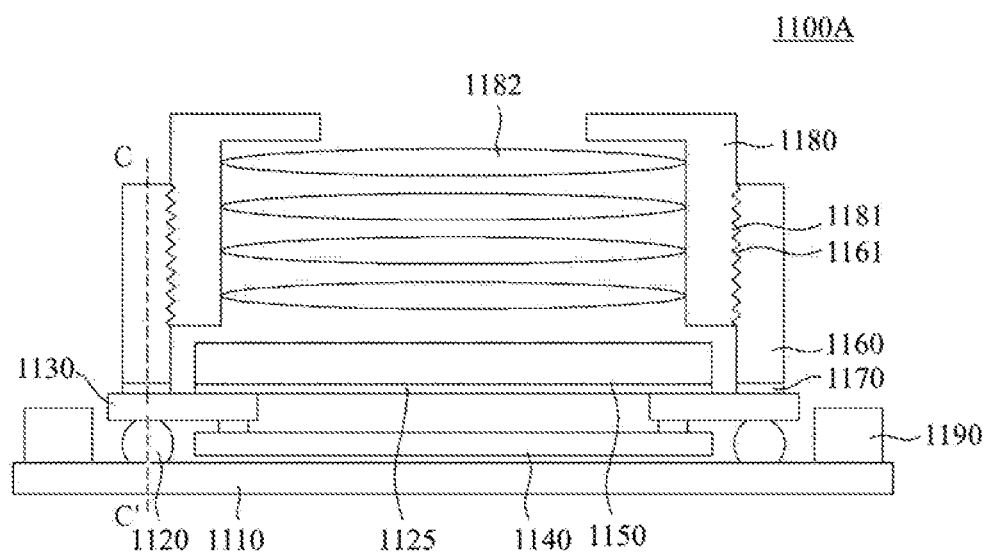
Figure 10:
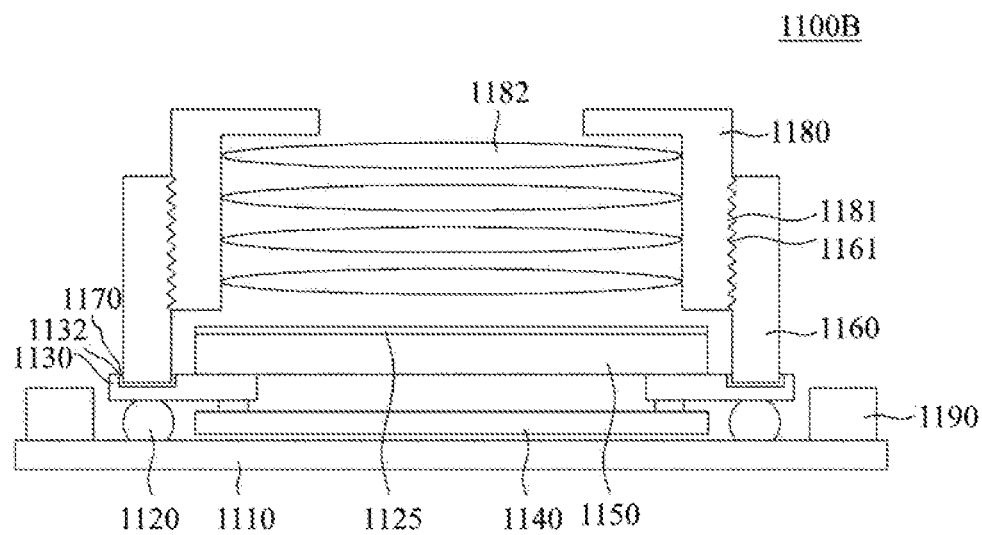
FIG. 10 is a cross-sectional view illustrating a camera module according to a second embodiment.
Figure 11:
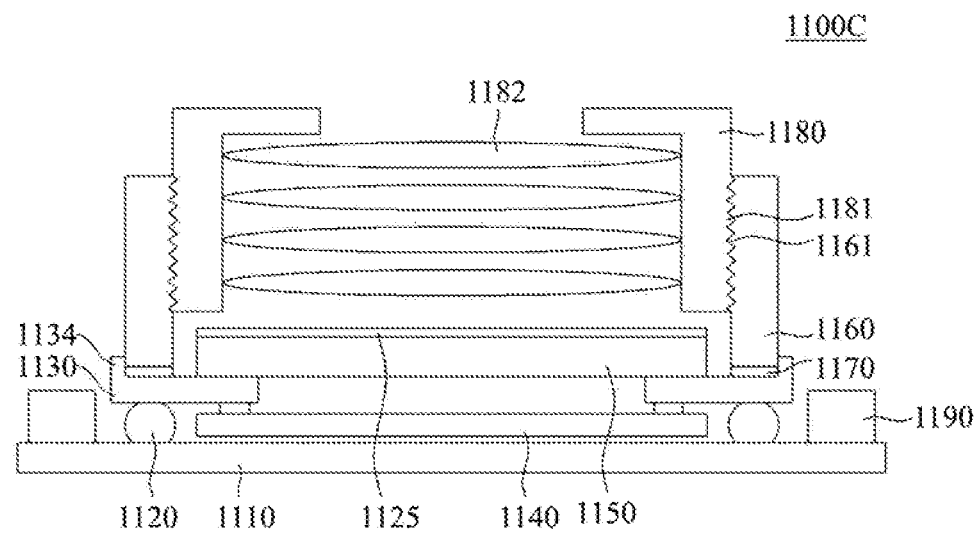
FIG. 11 is a cross-sectional view illustrating a camera module according to a third embodiment.

FIGS. 9a and 9b are cross-sectional views illustrating a camera module according to a first embodiment, FIG. 10 is a cross-sectional view illustrating a camera module according to a second embodiment, and FIG. 11 is a cross-sectional view illustrating a camera module according to a third embodiment.

Referring to FIGS. 9a to 11, the camera module 1100A, 1100B or 1100C according to the present embodiment may include a first printed circuit board 1110, first adhesive members 1120, a second printed circuit board 1130, an image sensor 1140, a filter 1150, and a housing 1160.

The first printed circuit board 1110 may be a rigid-flex printed circuit board (RFPCB), a PCB, a ceramic board, or the like.

The first adhesive members 1120 may be disposed on the first printed circuit board 1110, and the first adhesive members 1120 may be spaced apart from each other by a predetermined distance. Here, the spaced distance may be greater than the width of the image sensor 1140 in order to secure the space in which the image sensor 1140, which will be described below, may be disposed.

The second printed circuit board 1130 may be disposed on the first adhesive members 1120, and the second printed circuit board 1130 may be disposed so that the lower edge of the second printed circuit board 1130 may be adhered to the first adhesive members 1120.

The image sensor 1140 may be coupled to the lower portion of the second printed circuit board 1130 so as to be disposed between the first adhesive members 1120.

The image sensor 1140 serves to collect the incident light and generate an image signal. A semiconductor device used in the image sensor 1140 may be a Charged Coupled Device (CCD) or a CMOS image sensor, and may be a semiconductor device that captures an image of a person or an object using a photoelectric conversion element and a charge coupled device and outputs an electric signal.

The image sensor 1140 may be mounted on the first printed circuit board 1110 through a CSP process, as illustrated in FIGS. 9a to 11.

The CSP process refers to a package that includes an area not greater than 1.2 times that of a die or that has a solder ball pitch of 0.8 mm. The image sensor 1140 may take the form of a package, and may have a modular structure along with a filter 1150, a metal wiring pattern (not illustrated) formed on the filter 1150, and a passivation layer (not illustrated) for protecting the wiring pattern (not illustrated).

The image sensor 1140 may be coupled to the lower portion of the second printed circuit board 1130. The image sensor 1140 may be spaced apart upwards from the first printed circuit board 1110, and a space may be formed between the image sensor 1140 and the first printed circuit board 1110.

The filter 1150 may be disposed on the top of the second printed circuit board 1130.

The filter 1150 may be made of a glass material, and may be provided as a glass substrate.

In a conventional camera module, a housing is disposed on the edge of a first printed circuit board so as to surround a passive element disposed on the edge of the first printed circuit board. When the housing is disposed on the first printed circuit board, a reduction in the size of the camera module is limited.

In the present embodiment, the housing 1160 may be disposed on the upper edge of the second printed circuit board 1130.

Here, the center line C of the lower end surface of the housing 1160 may be disposed in an area in which the center line coincides with the center line C' of the first adhesive member 1120 in the vertical direction.

Since the housing 1160, to which a lens holder 1180 is fastened, is disposed on the second printed circuit board 1130 on which the image sensor 1140 is mounted, it is possible to prevent optical tilt, thereby realizing a high-resolution image.

The first adhesive member 1120 may include solder balls. When the height of the solder balls is too low, the space in which the image sensor 1140 is to be disposed may be too narrow. Conversely, when the height of the solder balls is too high, the overall height of the camera module 1100A, 1100B or 1100C may be increased when the housing 1160 is disposed on the second printed circuit board 1130, which is adhered on the solder balls.

Therefore, the height of the first adhesive members 1120 may be determined such that the minimum height of the camera module is maintained while securing the space in which the image sensor 1140 may be disposed.

A second adhesive member 1170 may be disposed between the upper surface of the second printed circuit board 1130 and the lower surface of the housing 1160. The second adhesive member 1170 may include at least one of thermosetting epoxy or UV curing epoxy.

Referring to FIG. 10, the second printed circuit board 1130 may be formed with a groove 1132, into which the lower end of the housing 1160 is inserted.

The second adhesive member 1170 may be disposed on the inner side surface and the bottom surface of the groove 1132 to adhere and fix the lower end of the housing 1160 to the groove 1132.

Since the lower end of the housing 1160 is inserted into and coupled to the groove 1132, the height of the housing 1160 may be reduced by the depth to which the lower end of the housing 1160 is inserted into the groove 1132.

As illustrated in FIG. 11, a protrusion 1134 may be formed on the exterior of the upper portion of the second printed circuit board 1130 so as to abut the outer lower end of the housing 1160.

The height of the protrusion 1134 may be greater than the thickness of the second adhesive member 1170 in order to prevent the second adhesive member 1170 from leaking out of the second printed circuit board 1130.

As illustrated in FIGS. 9a to 11, the image sensor 1140 may be flip-chip bonded to the second printed circuit board 1130.

When the image sensor 1140 is mounted on the second printed circuit board 1130 through the flip chip process, the second printed circuit board 1130 may be a multilayered ceramic board.

The flip chip process is a process in which an electrode pattern or an inner lead is formed with a protrusion using an energizing member such as a solder ball so as to realize electric connection when a chip such as the image sensor 1140 is mounted on the second printed circuit board 1130.

Accordingly, it is possible to reduce the connection space compared with conventional wire bonding. In particular, flip chip bumping is also generally referred to as under bump metallurgy (UBM). Since it is difficult to directly form a solder or an Au bump on an AL or Cu electrode of a semiconductor chip, in order to ensure easy adhesion and to prevent diffusion to the chip, a multilayered metal layer formed between the electrode and the bump may be composed of three layers including a bonding layer, a diffusion preventing layer, and a wettable layer. The flip chip connection process is known technology, and thus, an additional description thereof is omitted.

As illustrated in FIG. 9a, an infrared-blocking layer 1125 may be disposed on the surface of the filter 1150. However, the disclosure is not limited thereto, and the infrared-blocking layer may be disposed on the bottom surface of the filter 1150, as illustrated in FIG. 9b, or may be formed in the middle of the filter 1150. In addition, the infrared-blocking layer 1125 may be attached to the filter 1150 to have the form of a film or may be formed through coating. In addition, the infrared-blocking layer may also be an antiglare (AR) coating.

The infrared-blocking layer 1125 may optimize the range of light that the image sensor 1140 may sense. That is, when the image sensor 1140 senses near-infrared light (~1150 nm), other than visible light (400-700 nm), which is visible to the human eye, the image sensor 1140 may fail to capture only an image corresponding to the visible light and the voltage level of a pixel signal, which is the base of the image, may be saturated. Accordingly, the infrared-blocking layer 1125 may filter incoming optical signals and provide the filtered optical signals to the image sensor 1140.

The infrared-blocking layer 1125 may be manufactured by various methods. For example, the infrared-blocking layer 1125 may be manufactured through vacuum thin film deposition. Manufacture may be performed, for example, by alternately depositing (e.g., 30 to 40 layers of) two materials having different indices of refraction (e.g., $TiO_2/SiO_2$ or $Nb_2O_5/SiO_2$) on a glass substrate. Thus, the infrared-blocking layer 1125 manufactured by this method may transmit visible light and reflect near-infrared light. That is, the infrared-blocking layer 1125, which reflects the incoming infrared light, may be formed by stacking a plurality of layers. The infrared-blocking layer 1125 may be designed such that adjacent layers among these layers have different indices of refraction so as to extinguish the infrared light reflected from the respective layers via destructive interference. For example, there are infrared-blocking materials including high refractive index materials such as $TiO_2$, $ZrO_2$, $Ta_2O_6$ and $Nb_2O_5$, and low refractive index materials such as $iO_2$ and $MgF_2$, and an infrared-blocking layer may be generated by stacking these materials in multiple layers.

The infrared-blocking layer 1125 may block near-infrared light by absorbing the near-infrared light. In the case of the infrared-blocking layer 1125, the light introduced from the lateral side may be efficiently filtered. Examples of an infrared-absorbing material may include blue glass in which a pigment such as copper ions is dispersed. Alternatively, the infrared-blocking layer 1125 may be formed by combining a reflector that reflects infrared light and an absorber that absorbs infrared light.

When the infrared-blocking layer 1125 is disposed on the filter 1150, the filter 1150 may serve as an infrared-blocking filter even if a separate infrared-blocking filter is provided in the camera module. When the infrared-blocking layer 1125 is formed on the filter 1150, the camera module may be decreased in size since it is not necessary to provide a separate infrared-blocking filter.

The camera module 1100A, 1100B or 1100C according to the embodiment may further include a lens holder 1180 coupled inside the housing 1160. Then, at least one lens 1182 may be disposed in the lens holder 1180.

The lens holder 1180 may be screwed to the housing 1160. However, the disclosure is not limited thereto, and the housing 1160 may be integrally formed with the lens holder 1180.

A thread 1181 may be formed on the outer circumferential surface of the lens holder 1180, and at least one lens 1182 may be disposed inside the lens holder. Then, the thread 1181 is screwed into a female thread 1161 formed in the inner circumferential surface of the housing 1160 so that the focus between the lens 1182 and the image sensor 1140 may be adjusted. A camera module having an optical system formed in this manner is called a focusing-type camera module.

Meanwhile, although not illustrated, the housing 1160 may be integrally formed with the lens holder 1180. That is, when injection molding the housing 1160, the lens holder 1180 may be insert-injected therein, and a plurality of lenses 1182 may be directly fastened inside the lens holder 1180. A camera module having an optical system formed in this manner is called a focusing-free-type camera module.

The camera module according to the embodiment may further include a passive element 1190 disposed on the first printed circuit board 1110.

The passive element 1190 may be disposed on the edge of the first printed circuit board 1110 and may serve as a noise remover or a controller for image data processing of the image sensor 1140.

In addition, the passive element 1190 may be formed on the first printed circuit board 1110 via surface mount technology (SMT).

As described above, in the camera module according to the embodiment, since the housing, which has conventionally been disposed on the outermost portion of the first printed circuit board, is disposed on the second printed circuit board inside the first printed circuit board, it is possible to minimize the size of the camera module. In addition, since the housing, to which the lens holder is fastened, is disposed on the second printed circuit board on which the image sensor is mounted, it is possible to prevent optical tilt, thereby realizing a high-resolution image.

The first printed circuit board 1110, the second printed circuit board 1130, the first adhesive members 1120, the filter 1150, and the housing 1160 described in FIGS. 9a to 11 may respectively correspond to the second holder 600, the first holder 400, the conductive adhesive, the filter 410, and the base 210 described with reference to FIGS. 1 to 8.

Figure 12:
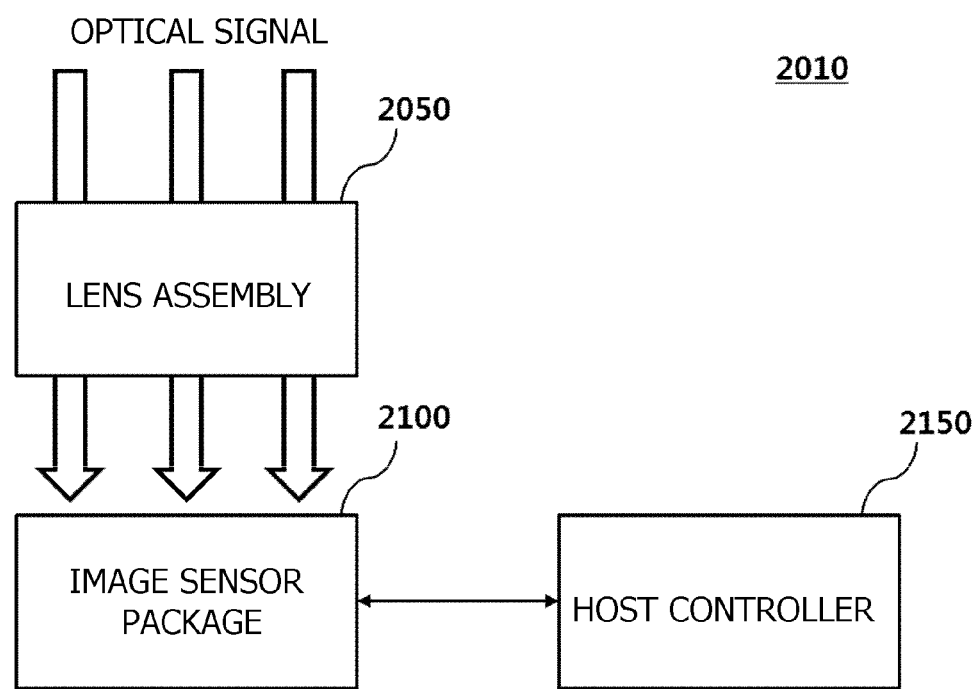
FIG. 12 is an explanatory view of an example of a camera device according to an embodiment of this disclosure.

FIG. 12 is an explanatory view of an example of a camera device 2010 according to an embodiment of this disclosure.

Referring to FIG. 12, the camera device 2010 may be implemented as a device including a camera module or a device having a camera function, such as a mobile phone, a smart phone, a tablet PC, or a notebook computer including a camera module. The camera module may include an image sensor package. The camera device 2010 may include a lens assembly 2050, an image sensor package 2100, and a host controller 2150. The camera module may be the image sensor package 2100 itself, or may include the lens assembly 2050 and the image sensor package 2100.

The lens assembly 2050 may receive optical signals introduced from outside the camera device 2010 and transmit the optical signals to the image sensor package 2100. The lens assembly 2050 refracts the optical signals with a field of view and a focal distance depending on the specifications required for the camera device 2010 and transmits the refracted optical signals to the image sensor package 2100.

The lens assembly 2050 may include at least one lens, or may form an optical system by aligning two or more lenses about the central axis thereof. In addition, the lens assembly 2050 may adjust the focal distance under the control of the host controller 2150 in order to provide the focal distance required by the host controller 2150.

To this end, the lens assembly 2050 may adjust the focal distance by varying the position of at least one lens using a voice coil motor (VCM). Alternatively, the lens assembly 2050 may include a liquid lens composed of a conductive liquid and a non-conductive liquid, which are not mixed with each other and form an interface, and may adjust the focal distance by controlling the interface between the conductive liquid and the non-conductive liquid using a driving voltage.

The image sensor package 2100 may include an image sensor. The image sensor converts an optical signal, which has passed through the lens assembly 2050, into an electric signal using each of a plurality of pixels and then generates a digital signal corresponding to the optical signal via analog-digital conversion of the converted electric signal. The plurality of pixels may be arranged in a matrix, and each of the plurality of pixels may include a photoelectric conversion element (e.g., a photodiode) and at least one transistor for sequentially outputting the voltage level of the photoelectric conversion element. The image sensor may output the digital signal corresponding to the optical signal in units of frames or pixels. In some embodiments, the image sensor may include an image signal processor (ISP) for processing and outputting the digital signal.

In addition to the image sensor, the image sensor package 2100 may include a component for protecting the image sensor, a component for electrical connection with the host controller 2150, and a component for coupling the image sensor to the lens assembly 2050. A more detailed configuration will be described with reference to FIG. 13.

The host controller 2150 may receive the digital signal (i.e., image data) corresponding to the optical signal from the image sensor package 2100 and may generate a control signal for controlling the operation of the image sensor. In some embodiments, the host controller 2150 may generate a control signal for controlling the VCM or a liquid lens of the lens assembly 2050.

The host controller 2150 may be implemented as a central processing unit (CPU), an application processor (AP), or the like, but the scope of the disclosure is not limited thereto.

Figure 13:
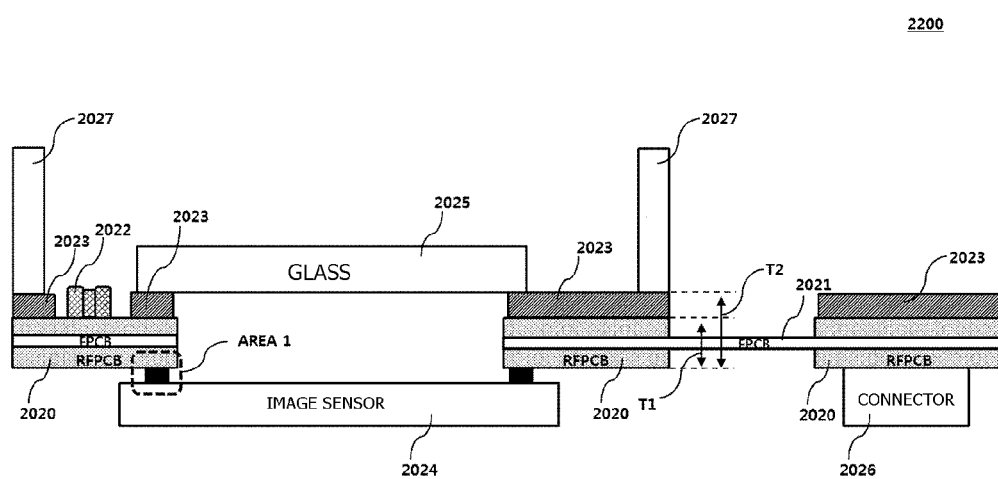
FIG. 13 is a view illustrating one embodiment of an image sensor package illustrated in FIG. 12.

FIG. 13 is a view illustrating one embodiment of an image sensor package illustrated in FIG. 12.

Referring to FIG. 13, the image sensor package 2200 includes a rigid flexible printed circuit board (RFPCB) 2020, a flexible printed circuit board (FPCB) 2021 included in the RFPCB 2020, a circuit element 2022, a reinforcement member 2023, an image sensor 2024, a glass 2025, a connector 2026, and outer walls 2027.

The RFPCB 2020 may be a PCB in which a rigid PCB overlaps and is joined to a section of the FPCB 2021 which is a flexible PCB. The RFPCB 2020 may be implemented so as to be very thin, and the rigid PCB and the flexible PCB may be electrically connected to each other.

As illustrated in FIG. 13, a section of the RFPCB 2021 (a section located between the right outer wall 2027 and the connector 2026) may be exposed to the outside, and the exposed section may be bent and mounted as needed as needed when mounted on the camera device 2010.

The RFPCB 2020 may be electrically connected to the image sensor 2024, and may also be connected to the connector 2026 so as to be electrically connected to an external control circuit (e.g., the host controller 2150 in FIG. 12).

A portion of the RFPCB 2020 (a section corresponding to the central portion of the image sensor 2024) may be removed through a punching process or a routing process. A portion of the RFPCB 2020 may be removed in order to allow optical signals to pass through the lens assembly 2050 and the glass 2025 without loss to thereby reach the image sensor 2024.

In some embodiments, the RFPCB 2020 may include s circuit (e.g., an ISP) for processing image data output from the image sensor 2024.

The circuit element 2022 may be a passive element (e.g., a capacitor or a resistor) or an active element (e.g., an OPAMP) for constituting a circuit when the RFPCB 2020 includes a separate circuit. The element may be shaped so as to protrude from the PCB.

The reinforcement member 2023 serves to reinforce the strength of the RFPCB 2020 in order to prevent deformation thereof. The reinforcement member may be disposed on the top of the RFPCB 2020 except for a position corresponding to the circuit element 2022. The reinforcement member 2023 may be formed of aluminum having high thermal conductivity and high strength, and the exterior of the aluminum may be coated with a black coating material having high light absorptance in order to lower the reflectance of optical signals. The reinforcement member 2023 may be bonded to the RFPCB 2020 through a bonding process, but the scope of the disclosure is not limited thereto.

The image sensor 2024 may refer to the image sensor described in FIG. 12. The image sensor 2024 may be electrically connected to the RFPCB 2020 through a flip chip process in a first area AREA1. Although only one left area is designated as the first area AREA1 in FIG. 13, the area on the opposite right side about the image sensor 2024 also corresponds to the first area AREA1.

The flip chip process refers to a process of forming a bump on a chip without wire bonding and then bringing the bump into contact with a mounting board so as to connect the chip to a circuit of the mounting board. Here, the chip may be the image sensor 2024, and the mounting board may be the RFPCB 2020.

The glass 2025 may be formed of a glass having high transparency and may have a predetermined curvature in order to guide optical signals to an area in which an active area of the image sensor 2024, that is, pixels, is located. An infrared-ray (IR) film may be attached to the top of the glass 2025 to block infrared rays. In addition, the glass 2025 may be a filter that restricts or passes a certain wavelength of external light. For example, the glass 2025 may be an IR-cut filter. The glass 2025 may be bonded to the reinforcement member 2023 through a bonding process. The glass 2025 may be directly bonded to the RFPCB 2020 in some cases, but the RFPCB 2020 may be relatively more elastic than the reinforcement member 2023, and therefore may be deteriorated in adhesive force with the glass 2025 when bending, twisting or the like thereof occurs. The reinforcement member 2023 may be disposed on the RFPCB 2020 and the glass may be disposed on the reinforcement member 2023 in order to compensate for deterioration in the adhesive force, for example.

The connector 2026 may include at least one terminal, which electrically connects RFPCB 2020 to an external control circuit (e.g., the host controller 2150 in FIG. 12).

The outer walls 2027 may serve to protect the circuit element 2022, the glass 2025, and the like from other external modules, and may be bonded to the reinforcement member 2023 through a bonding process. The outer walls 2027 may be attached to and fixed to the lens assembly 2050.

The RFPCB 2020 may have a first thickness T1 (within a range from about 0.15 mm to about 0.25 mm) and a combination of the RFPCB 2020 and the reinforcement member 2023 may have a second thickness T2 (within a range from about 0.2 mm to about 0.4 mm)

In the image sensor package 2200 according to the embodiment of the present invention, since the sum of the thicknesses of the RFPCB 2020 and the reinforcement member 2023 above the image sensor 2024 (in the direction in which optical signals are introduced) is merely the second thickness, the sum of the thicknesses of the image sensor package 2200 and the lens assembly 2050 may be reduced, which may increase the margin of design in the vertical direction of the lens assembly 2050. Due to the increase in the margin of design, the lens assembly 2050 may increase the number of lenses and the distance to which the lenses may be moved by the VCM, which may enhance the performance of the camera device.

In addition, it is possible to increase the margin of design for any other module which may be disposed below the image sensor 2025 (in the direction opposite the direction in which the optical signals are introduced) and to reduce the thickness of the entire camera device 2010, which may contribute to the miniaturization of the camera device 2010.

In addition, a process required for electrical connection from the image sensor 2024 to the RFPCB 2021 requires only one flip chip process, which may simplify the entire process.

According to another embodiment, the reinforcement member 2023 may not be included in the structure of the image sensor package 2200 in FIG. 13, in which case the overall thickness of the image sensor package 2200 may be further reduced.

In FIG. 13, the image sensor 2024 has a form of being exposed downwards. When other components in the camera device 2010 are disposed below the image sensor package 2200, a protective cap (not illustrated) may be attached so as to surround the image sensor 2024 in order to prevent impacts from being applied to the image sensor 2024.

The protective cap (not illustrated) may have a greater area and height than the image sensor 2024 and may be shaped so as to have one open surface. The protective cap may be attached to the RFPCB 2020 through a bonding process so as to surround the image sensor 2024. The protective cap (not illustrated) may be realized as a plastic workpiece having high thermal conductivity and high strength, but the scope of the disclosure is not limited thereto.

Figure 14:
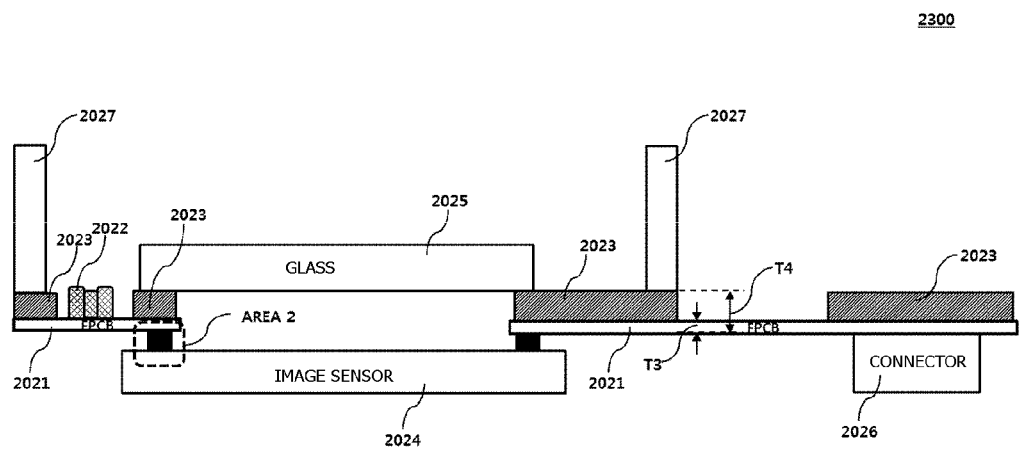
FIG. 14 is a view illustrating another embodiment of the image sensor package illustrated in FIG. 12.

FIG. 14 is a view illustrating another embodiment of the image sensor package illustrated in FIG. 12.

Referring to FIG. 14, an image sensor package 2300 may include the FPCB 2021, the circuit element 2022, the reinforcement member 2023, the image sensor 2024, the glass 2025, the connector 2026, and the outer walls 2027.

That is, the image sensor package 2300 may have a structure in which only the FPCB 2021, but not the RFPCB 2020, is included, unlike the image sensor package 2200 of FIG. 13.

Thus, a flip chip process of connecting the image sensor 2024 to the FPCB 2021 may be performed on the FPCB 2021 in a second area AREA2. However, since the flip chip process may require a certain level of strength or more, the flip chip process may be performed after the FPCB 2021 and the reinforcement member 2023 are attached to each other.

As a result, the FPCB 2021 may have a third thickness T3 (of about 0.05 mm), and a combination of the FPCB 2021 and the reinforcement member 2023 may have a fourth thickness T4 (within a range from about 0.1 to about 0.2 mm). Thereby, the overall thickness of the image sensor package 2300 may be further reduced.

Here, in order to increase the strength of the FPCB 2021, the reinforcement member illustrated in FIG. 14 may be thicker than the reinforcement member illustrated in FIG. 13.

For convenience of description, the description related to FIG. 14 is focused on differences from FIG. 13, and the image sensor package 2300 may have substantially the same structure, material, and function as the image sensor package 2200 except for these differences.

Figure 15:
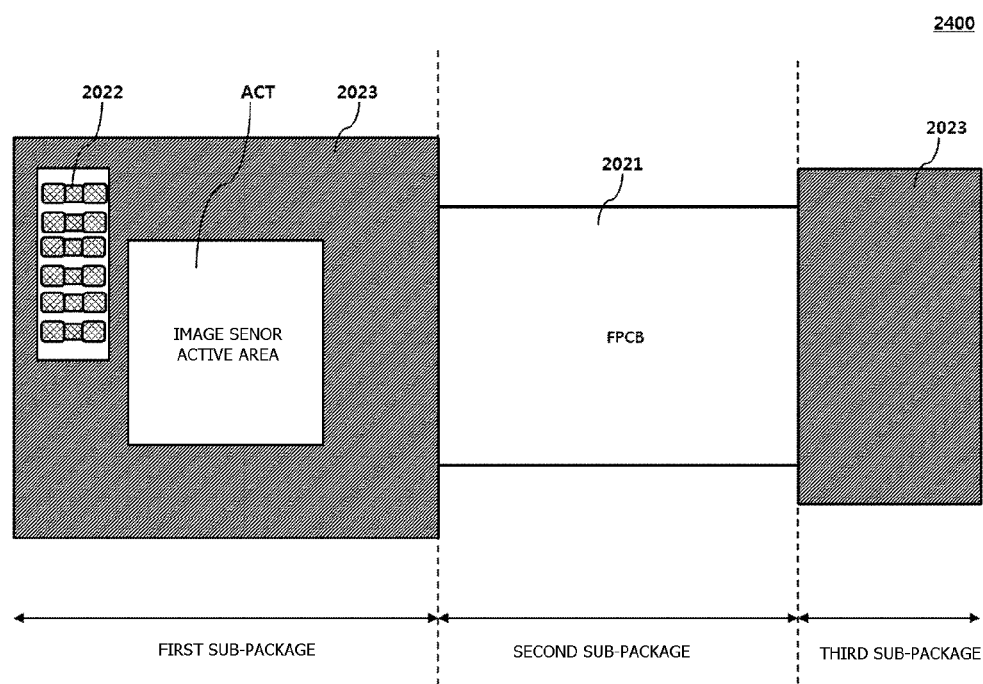
FIG. 15 is a top view of the image sensor package illustrated in FIG. 13 or FIG. 14.

FIG. 15 is a top view of the image sensor package illustrated in FIG. 13 or FIG. 14.

Referring to FIG. 15, an upper surface 2400 of the image sensor package 2200 or the image sensor package 2300, which is viewed from above, includes the reinforcement member 2023 disposed on the top of the FPCB 2021. An area of the RFPCB 2020 or the FPCB 2021, which corresponds to an active area ACT of the image sensor 2024 in which a plurality of pixels is located, may be removed to enable transmission of optical signals.

The reinforcement member 2023 may not be provided, and the circuit element 2022 may be disposed on a portion of the RFPCB 2020 or the FPCB 2021, and the position of the circuit element 2022 and the number of circuit elements are not limited to those illustrated in FIG. 15.

In addition, another portion (central portion) of the RFPCB 2020 or the FPCB 2021 is exposed without being attached to the reinforcement member 2023 so as to be bent according to the internal design specifications of the camera device 2010.

The left area about the exposed FPCB 2021, in which the image sensor 2024 is disposed, may be referred to as a first sub-package, the area corresponding to the exposed FPCB 2021 may be referred to as a second sub-package, and the right area about the exposed FPCB 2021, in which the connector 2026 is disposed may be referred to as a third sub-package.

Figure 16:
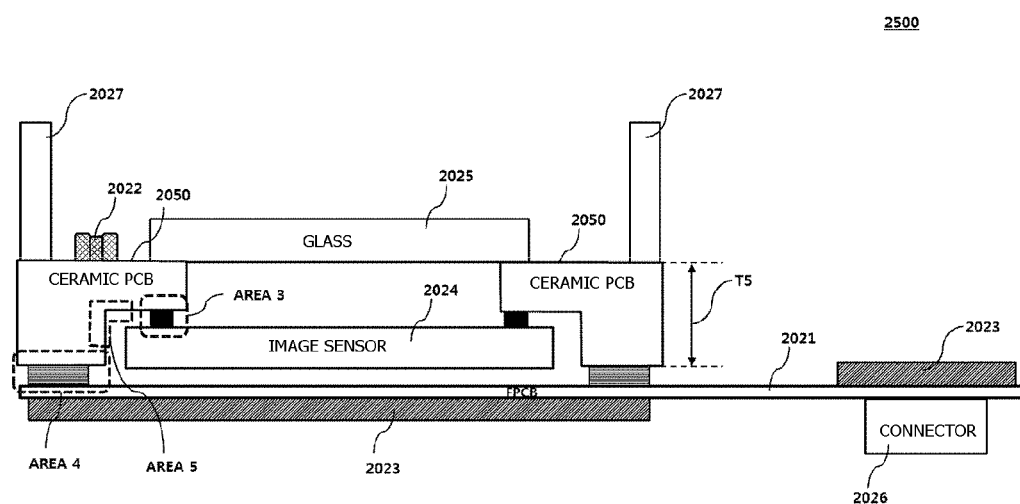
FIG. 16 is a view illustrating an image sensor package according to a comparative example of this disclosure.

FIG. 16 is a view illustrating an image sensor package according to a comparative example of this disclosure.

Referring to FIG. 16, the image sensor package 2500 has a function similar to that of the image sensor package 2100 illustrated in FIG. 12, but has a structure different from that of the image sensor package illustrated in FIG. 13 or FIG. 14.

More specifically, the image sensor 2024 may be electrically connected to a third area AREA3 via a ceramic PCB 2050 through a flip chip process.

The ceramic PCB 2050 is a PCB formed of a ceramic material and has a sufficient strength to perform a flip chip process. However, tool costs may increase due to shrinkage/expansion during processing, and mass-production may be difficult due to an array-type process.

In addition, due to the characteristics of the ceramic material, a high firing temperature (about 1300° C.) is required, and it is impossible for the ceramic PCB 2050 to directly insert an FPCB thereinto, like an RFPCB.

Therefore, after the ceramic PCB 2050 and the image sensor 2024 are connected to each other, the ceramic PCB 2050 is electrically connected to the FPCB 2021 via a fourth area AREA4 through an anisotropic conducting film (ACF) so that two PCBs are stacked. The ACF process refers to a process of inserting an ACF film between two PCBs and applying heat to bond the two PCBs.

The reinforcement member 2023 may be attached to the lower portion of the FPCB 2021 to increase the strength of the FPCB. In order to satisfy the limitation of a design, the connector 2026 may be attached to the lower portion of the FPCB 2021 and the reinforcement member 2023 may be attached to the upper portion of the FPCB 2021 so as to be opposite the connector 2026.

Here, the ceramic PCB 2050 needs to have a fifth thickness (of about 0.6 mm) or more in order to prevent cracks during shrinkage and expansion in the process.

In some embodiments, a cavity PCB structure may be used in order to prevent the overall thickness of the image sensor package 2500 from increasing. The cavity PCB structure refers to a structure in which the overall thickness may be reduced while the number of stacked PCBs is maintained. This corresponds to the structure in which the image sensor 2024 is included in the form of a packet inside the ceramic PCB 2050 through a process of etching the ceramic PCB 2050 in an area of a fifth area AREA5 in which the image sensor 2024 and the ceramic PCB 2050 overlap each other.

The overall thickness of the image sensor package 2500 must be increased due to the influence of the ceramic PCB 2050, and the thickness must be additionally increased since a separate FPCB 2021 needs to be used.

In addition, when the cavity structure is used in order to minimize an increase in the thickness of the image sensor package 2500, an additional etching process is required, and an ACF process for connection between the ceramic PCB 2050 and the FPCB 2021 is additionally required, which increases costs.

The RFPCB 2020, the image sensor 2024, and the glass 2025 described in FIGS. 12 to 16 may respectively correspond to the first holder 400, the image sensor 500, and the filter 410 described with reference to FIGS. 1 to 8. In addition, needless to say, the embodiment described with reference to FIGS. 12 to 16 may further include the second holder 600 when it includes the technical features of the embodiment described with reference to FIGS. 1 to 8.

The camera module according to an embodiment of the present invention may include all of a first feature, which is a technical feature of the embodiment described with reference to FIGS. 1 to 8, a second feature, which is a technical feature of the embodiment described with reference to FIGS. 9a to 11, and a third feature, which is a technical feature of the embodiment described with reference to FIGS. 12 to 16.

For example, the camera module may include all of a feature (an exemplary first feature) in that a first holder and a second holder are coupled and electrically connected to each other by a conductive adhesive and the second holder surrounds an image sensor coupled to the lower portion of the first holder, a feature (an exemplary second feature) in that a housing is disposed on a second printed circuit board, which is adhered at the lower edge thereof to a first adhesive member, which is disposed so as to be spaced apart from a first printed circuit board, and a feature (an exemplary third feature) in that an RFPCB is disposed above an image sensor and is electrically connected to the image sensor.

In a camera module according to another embodiment of the present invention, any one of the first to third features may be omitted as needed.

In other words, the camera module according to the embodiment of the present invention may include any one of the first to third features, or may include a technical feature obtained by combining at least two of the first to third features.

Although only several embodiments have been described above, various other embodiments are possible. The technical ideas of the embodiments described above may be combined into various forms unless they are incompatible techniques, and thereby new embodiments may be realized.

The above described features, configurations, effects, and the like are included in at least one of the embodiments, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the embodiments as disclosed in the accompanying claims.

INDUSTRIAL APPLICABILITY

Embodiments may be applied to a camera module including an image sensor for photographing a subject and a portable device including the same.

What is claimed is:
1. A camera module comprising:
a lens driving device having a housing;
a first circuit board disposed below the housing;

a filter disposed on an upper surface of the first circuit board;

a second circuit board disposed below the first circuit board;

an image sensor disposed above the second circuit board and coupled to a lower surface of the first circuit board, the image sensor having an upper surface facing the filter and a lower surface opposite the upper surface; and a first adhesive member disposed between the lower surface of the first circuit board and an upper surface of the second circuit board, and electrically connecting the first circuit board and the second circuit board, wherein the lower surface of the image sensor is higher than the upper surface of the second circuit board.

2. The camera module according to claim 1, wherein a length of the first adhesive member in a first direction is greater than a length of the image sensor in the first direction, and the first direction is a direction perpendicular to the upper surface of the second circuit board.

3. The camera module according to claim 1, wherein the first adhesive member is a solder ball.

4. The camera module according to claim 1, wherein the lens driving device comprises a lens holder coupled to the housing.

5. The camera module according to claim 1, wherein the first circuit board and the image sensor are coupled and electrically connected to each other by a conductive adhesive.

6. The camera module according to claim 1, wherein an edge of the lower surface of the first circuit board is adhered to the first adhesive member.

7. The camera module according to claim 1, wherein the second circuit board is a printed circuit board or ceramic board and the first circuit board is a printed circuit board.

8. The camera module according to claim 1, wherein the housing is coupled to an edge of the upper surface of the first circuit board.

9. The camera module according to claim 8, wherein the filter is coupled to an inner side of the edge of the upper surface of the first circuit board.

10. The camera module according to claim 8, further comprising a second adhesive member disposed between the housing and the first circuit board, wherein the second first adhesive member is coupled to the housing and the first circuit board.

11. The camera module according to claim 1, wherein the filter is an infrared-blocking filter or a blue filter.

12. The camera module according to claim 1, wherein the lower surface of the image sensor is spaced apart from the second circuit board.

13. The camera module according to claim 1, wherein the first circuit board comprises a groove, and a lower end of the housing is inserted to and coupled to the groove.

14. The camera module according to claim 1, wherein the first circuit board comprises a protrusion formed on the upper surface thereof so as to abut an outer lower end of the housing.

15. A camera module comprising:

a housing;

a lens holder disposed in the housing;

a first circuit board disposed below the lens holder;

a filter disposed on an upper surface of the first circuit board;

a second circuit board disposed below the first circuit board;

an image sensor disposed above the second circuit board and coupled to a lower surface of the first circuit board;

a first adhesive member disposed between the lower surface of the first circuit board and an upper surface of the second circuit board and electrically connecting the first circuit board and the second circuit board; and a conductive adhesive electrically connecting the image sensor and the first circuit board, wherein the first adhesive member is a solder ball, wherein a thickness of the first adhesive member in a direction perpendicular to the upper surface of the second circuit board is greater than a thickness of the image sensor in the direction perpendicular to the upper surface of the second circuit board, and wherein the conductive adhesive is overlapped with the image sensor in a first direction, and the first direction is a direction parallel to the upper surface of the second circuit board.

16. The camera module according to claim 15, wherein a lower surface of the image sensor is higher than the upper surface of the second circuit board.

17. The camera module according to claim 15, wherein a lower surface of the image sensor is spaced apart from the second circuit board.

18. The camera module according to claim 15, wherein the first circuit board comprises a groove, and a lower end of the housing is inserted to and coupled to the groove.

19. The camera module according to claim 15, wherein the first circuit board comprises a protrusion formed on an upper surface thereof so as to abut an outer lower end of the housing.

20. A portable device comprising:

a display module having a plurality of pixels;

the camera module according to claim 1; and a controller configured to control an operation of the display module and the camera module.

* * * * *